(12) United States Patent
Zhang

(10) Patent No.: US 6,320,224 B1
(45) Date of Patent: Nov. 20, 2001

(54) METHOD FOR PRODUCING A SEMICONDUCTOR INTEGRATED CIRCUIT INCLUDING A THIN FILM TRANSISTOR AND A CAPACITOR

(75) Inventor: Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/110,895

(22) Filed: Jul. 7, 1998

Related U.S. Application Data

(62) Division of application No. 08/585,916, filed on Jan. 16, 1996, now Pat. No. 5,814,529.

(30) Foreign Application Priority Data

Jan. 17, 1995 (JP) ...................................................... 7-22256

(51) Int. Cl.[7] .................................................. H01L 29/00
(52) U.S. Cl. .......................... 257/347; 257/348; 257/349; 257/350; 257/59; 257/72
(58) Field of Search ....................... 257/59, 72, 347–350, 257/68

(56) References Cited

U.S. PATENT DOCUMENTS

| | | | |
|---|---|---|---|
| 5,182,620 | 1/1993 | Shimada et al. | 349/39 |
| 5,247,289 | 9/1993 | Matsuda | 239/39 |
| 5,292,675 | 3/1994 | Codama . | |
| 5,292,677 | 3/1994 | Dennison | 437/60 |
| 5,308,998 | 5/1994 | Yamazaki et al. . | |
| 5,414,278 | 5/1995 | Kobayashi | 349/39 |
| 5,498,562 | 3/1996 | Dennison et al. | 437/60 |
| 5,499,123 | 3/1996 | Mikoshiba . | |
| 5,512,779 | 4/1996 | Noda | 257/640 |
| 5,663,077 | 9/1997 | Adachi et al. . | |
| 5,712,495 | 1/1998 | Suzawa . | |
| 5,737,049 | * 4/1998 | Shin et al. | 257/59 |
| 5,771,110 | * 6/1998 | Hirano et al. | 257/72 |
| 5,789,762 | * 8/1998 | Koyama et al. | 257/72 |
| 5,808,315 | * 9/1998 | Murakami et al. | 257/59 |
| 5,831,284 | * 11/1998 | Park et al. | 257/68 |
| 5,847,410 | * 12/1998 | Nakajima | 257/72 |
| 5,880,038 | * 3/1999 | Yamakazi et al. | 438/756 |

FOREIGN PATENT DOCUMENTS

| | | |
|---|---|---|
| 2-100024 | 4/1990 | (JP) . |
| 5-55581 | 3/1993 | (JP) . |
| 5-55582 | 3/1993 | (JP) . |

* cited by examiner

Primary Examiner—Fetsum Abraham
(74) Attorney, Agent, or Firm—Eric J. Robinson; Nixon Peabody LLP

(57) ABSTRACT

The formation of contact holes and a capacitor is performed in a semiconductor integrated circuit such as an active matrix circuit. An interlayer insulator having a multilayer (a lower layer is silicon oxide; an upper layer is silicon nitride) each having different dry etching characteristic is formed. Using a first mask, the silicon nitride corresponding to the upper layer in the interlayer insulator is etched by dry etching. This etching is completed by using the silicon oxide corresponding to the lower layer as an etching stopper. A pattern is formed using a second mask to form selectively the silicon oxide corresponding to the lower layer. Thus a first portion that the silicon oxide and the silicon nitride are etched and a second portion that only silicon nitride is etched are obtained. The first portion is used as a contact hole. A capacitor is formed in the second portion.

49 Claims, 5 Drawing Sheets

METHOD FOR PRODUCING A SEMICONDUCTOR INTEGRATED CIRCUIT INCLUDING A THIN FILM TRANSISTOR AND A CAPACITOR

This application is a division of Ser. No. 08/585,916 filed Jan. 16, 1996, now U.S. Pat. No. 5,814,529.

BACKGROUND OF THE INVENTION

1. Field of the Invention

The present invention relates to a method for effectively forming a contact hole and a capacitor in a semiconductor integrated circuit.

2. Description of the Related Art

In a semiconductor integrated circuit, a multilayer wiring structure is used, it is necessary to form a contact hole for connecting with wirings one another and an element such as a capacitor (condenser). To obtain the multilayer wiring structure, an interlayer insulator is formed in general, so that insulation and capacitance between the wirings are decreased. In a portion required to connect with the wirings one another, a contact hole is formed in the interlayer insulator. When a capacitor is formed, the interlayer insulator itself may be used as dielectric. However, since the interlayer insulator is used to decrease insulation and capacitance between the wirings, when the interlayer insulator is used as dielectric of the capacitor, an area of the capacitor is extremely large and thus loss is great in a circuit design.

If an interlayer insulator is thin, the capacitor having a large capacitance can be formed in the same area. However, to achieve this, it is necessary to remove the interlayer insulator completely in a contact hole forming portion and to etch the interlayer insulator suitably (until a suitable thickness required to form a capacitor) in a capacitor forming portion. Thus, it is impossible to use such the capacitor actually in mass production process.

To operate a capacitor effectively, it is required that a thickness of a portion of an interlayer insulator used as dielectric is $1/5$ to $1/50$ thinner than an initial thickness of an interlayer insulator. If a capacitance of a capacitor is 100 times larger than that of an intersection portion of a normal wiring and an interlayer insulator formed in a portion of the capacitor has the same thickness as the intersection portion of the normal wiring, it is required that an area of the capacitor is 1000 times larger than that of the intersection portion of the wiring. On the other hand, if a thickness of the portion of the capacitor is $1/10$, the area of the capacitor is 100 times larger than that of the intersection portion, and thus it is effective in integration of elements. However, for example, it is impossible to etch an interlayer insulator by 90% in thickness to and remain it by only 10% in thickness. Thus, precision control cannot be performed substantially in a desired area.

SUMMARY OF THE INVENTION

In the present invention, an interlayer insulator is constructed by at least two materials (such as an upper layer and a lower layer) each having different dry etching characteristics. When the upper layer is etched by dry etching, a thickness of the lower layer can be controlled precisely by using the lower layer as an etching stopper. By using a first mask, a desired region in the upper layer can be etched selectively.

After the desired region in the upper layer is etched and removed, the lower layer is etched selectively using a second mask in a contact hole forming portion. This etching process may be dry etching or wet etching. In a capacitor forming portion, the lower layer is covered with a mask to prevent etching. In an etching condition for the lower layer, when the upper layer is not etched sufficiently, the second mask may be used to expose a portion other than the portion etched by using the first mask.

In particular, in the present invention, when the Interlayer insulator has two layer structures wherein the upper layer is formed by a material containing mainly silicon nitride and the lower layer is formed by a material containing mainly silicon oxide, it is superior because dry etching characteristics are different largely each other.

A transparent conductive material such as ITO (indium tin oxide) may be used as the second mask. For example, a pixel electrode in a TFT array of an active matrix type liquid crystal display can be used as the second mask. In this case, a photolithography process can be omitted.

According to the present invention, there is provided a method for producing an semiconductor integrated circuit comprising the steps of: forming an interlayer insulator including at least upper and lower layers each having different dry etching characteristics; etching the upper layer of the interlayer insulator using a first mask, wherein the lower layer of the interlayer insulator is used as an etching stopper; forming a second mask to cover a portion of the lower layer of the interlayer insulator exposed by the etching step; selectively etching the lower layer of the interlayer insulator using the second mask; forming a contact hole in one portion that the upper and lower layers of the interlayer insulator are etched; and forming a capacitor in another portion that only the upper layer of the interlayer insulator is etched.

According to the present invention, there is provided a method for producing an semiconductor integrated circuit comprising the steps of: forming an interlayer insulator including upper and lower layers, wherein the upper layer has silicon nitride and the lower layer has silicon oxide; etching the upper layer of the interlayer insulator using a first mask, wherein the lower layer of the interlayer insulator is used as an etching stopper; forming a second mask to cover a portion of the lower layer of the interlayer insulator exposed by the etching step; selectively etching the lower layer of the interlayer insulator using the second mask; forming a contact hole in one portion that the upper and lower layers of the interlayer insulator are etched; and forming a capacitor in another portion that only the upper layer of the interlayer insulator is etched.

According to the present invention, a thickness of dielectric of a capacitor is determined by a thickness of a lower layer of an interlayer insulator. In an upper layer etching process, since the lower layer serves as an etching stopper, the thickness of dielectric of a capacitor can be uniform in an entire area. When a thickness of the lower layer of the interlayer insulator is $1/5$ to $1/50$ of an entire thickness of the interlayer insulator, since a thickness of dielectric of the capacitor can be sufficiently thin, it is effective to reduce an area of the capacitor. When a dielectric constant of a material used in the upper layer is different from that of a material used in the lower layer, it is necessary to consider its effect.

DETAILED DESCRIPTION OF THE PREFERRED EMBODIMENTS

Embodiment 1

FIGS. 1A to 1E show a process for producing one pixel in a thin film transistor (TFT) array of an active matrix circuit used in a liquid crystal display device, according to the embodiment.

A silicon oxide film 102 having a thickness of 1000 to 5000 Å, for example, 4000 Å, is formed as a base oxide film on a substrate 101 such as a glass substrate (Corning 7059). After an amorphous or crystalline island silicon region having a thickness of 100 to 1500 Å, for example, 800 Å is formed, a gate insulating film 104 is formed by a silicon oxide having a thickness of 1200 Å.

Figure 1A:
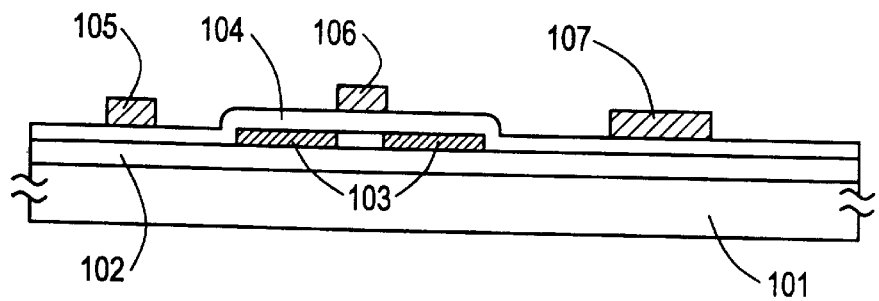
FIGS. 1A to 1E show a process for producing a thin film transistor (TFT) according to Embodiment 1.

A polycrystalline silicon film having good conductivity obtained by introducing phosphorus at a desired quantity is formed at a thickness of 3000 Å by low pressure chemical vapor deposition (LPCVD) and then etched to form a gate electrode 106 and lower layer wirings 105 and 107. Then, by ion doping, an impurity (phosphorus in the embodiment) is implanted into the island silicon region using the gate electrode 106 as a mask in a self-alignment, to form impurity regions 103. The impurity region may be formed before the gate electrode is formed. (FIG. 1A)

Figure 1B:
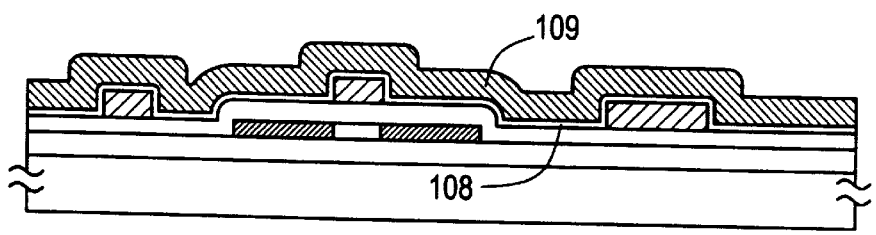

A silicon oxide film 108 having a thickness of 200 to 1000 Å, for example, 500 Å, is formed by plasma CVD, and then a silicon nitride film 109 having a thickness of 2000 to 10000 Å, for example, 5000 Å is formed by plasma CVD, thereby to form an interlayer insulator. (FIG. 1B)

Figure 1C:
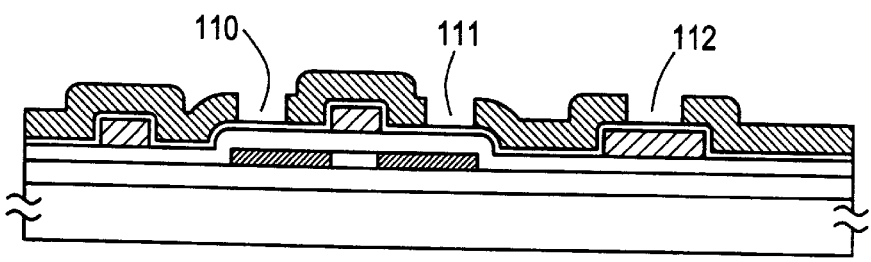

Using a first mask, a pattern is formed by a known photoresist method, and then the silicon nitride film 109 corresponding to an upper layer in the interlayer insulator is etched by dry etching. By setting a suitable etching condition, the silicon nitride film 108 corresponding to the upper layer can be used as an etching stopper. Thus, hole portions 110, 111 and 112 are formed. (FIG. 1C)

Figure 1D:
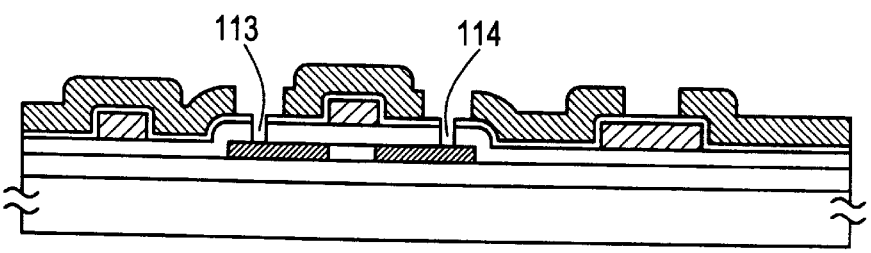

Then, a hole pattern is formed again inside the hole portions 110 and 111 by photolithography using a second mask. A hole pattern is not formed in the hole portion 112. The gate insulating film 104 of a silicon oxide and the silicon oxide film 108 are etched using buffer hydrofluoric acid, to form contact holes 113 and 114. Since this etching is performed by isotropic wet etching, it is required that a size (diameter) of the contact hole 113 or 114 is smaller than that of the hole portion 110 or 111. (FIG. 1D)

A pixel electrode 115 is formed by using an indium tin oxide (ITO) film having a thickness of 1000 Å. An aluminum film having a thickness of 5000 Å is formed by sputtering and then etched to form metal wiring-electrodes 116 and 117 corresponding to the upper layer. The metal wiringelectrodes 116 and 117 are connected to the impurity regions 103 of the TFT through the contact holes 113 and 114. In the hole portion 112, the silicon oxide film 108 corresponding to the lower layer in the interlayer insulator is used as dielectric, and a capacitor 119 is formed between the pixel electrode 115 made of the ITO film and the lower layer wiring 107. The capacitor 119 corresponds to a retaining capacitor (auxiliary capacitor) in a TFT array of an active matrix circuit.

Figure 1E:
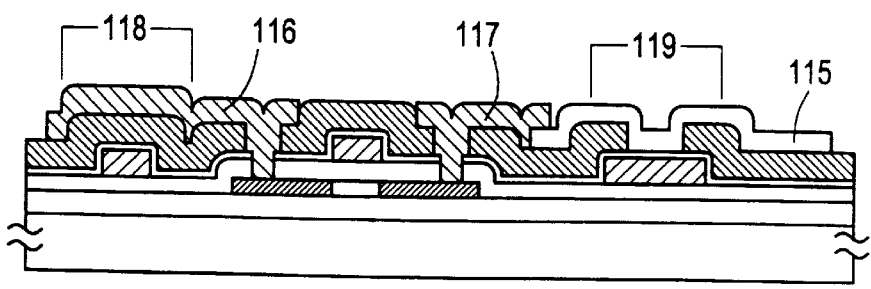

In a portion 118 in which the upper layer wiring 116 (corresponding to a source bus line of an active matrix circuit) is formed across on the lower layer wiring 105 (corresponding to a gate bus line of the active matrix circuit), since the silicon nitride film 109 having a thickness of 5000 Å also serves as an insulator in addition to the silicon oxide film 108 having a thickness of 500 Å, sufficient insulation can be obtained. (FIG. 1E)

In the embodiment, the upper electrode of the capacitor is formed using the pixel electrode 115 made of the ITO film. It may be formed by extending the upper layer wiring 117 on the lower layer wiring 107. Also, in the embodiment, the pixel electrode 115 is formed before the upper layer metal wiring 117 is formed. It may be formed after the upper layer metal wiring 117 is formed.

Embodiment 2

FIGS. 2A to 2E show a process for producing an active matrix circuit used in a liquid crystal display device, according to the embodiment.

Figure 2A:
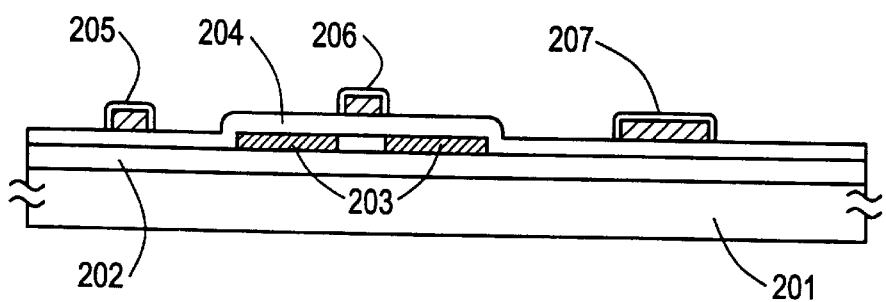
FIGS. 2A to 2E show a process for producing a TFT according to Embodiment 2.

As described in Embodiment 1, a base oxide film 202 and an island silicon region are formed on a substrate 201 such as a glass substrate (Corning 7059), and then a gate insulating film of silicon oxide having a thickness of 1200 Å is formed. Further, an aluminum film into which scandium is mixed (added) at 0.3 weight % is formed at a thickness of 5000 Å by sputtering and then etched to form a gate electrode 206 and aluminum lower layer wirings 205 and 207. In the embodiment, as described in Japanese Patent Application Open No. 5-267667, anodization is performed in an electrolytic solution using the gate electrode 206 and the aluminum wirings 205 and 207 as anodes, so that fine anodic oxide layers having a thickness of 1000 Å are formed around the gate electrode 206 and the aluminum wiring 205 and 207. Impurity regions 203 are formed in the island silicon region in a self-alignment or a non-self-alignment. (FIG. 2A)

Figure 2B:
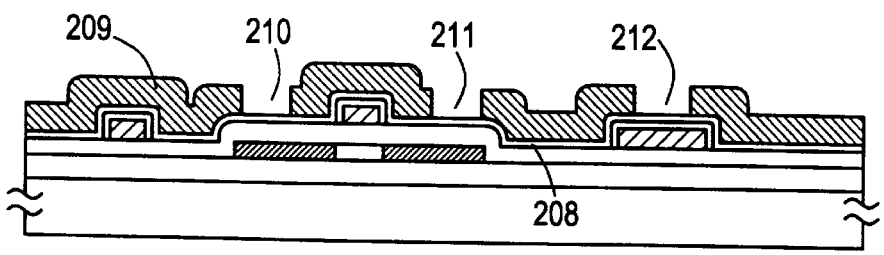

As described in Embodiment 1, a silicon oxide film 208 having a thickness of 300 Å and a silicon nitride film 209 having a thickness of 4700 Å are formed successively by plasma CVD. Using a first mask, hole portions 210 to 212 are formed in the silicon nitride film 209 by dry etching. In this state, the silicon nitride film 208 serves as an etching stopper, as described in Embodiment 1. (FIG. 2B)

Figure 2C:
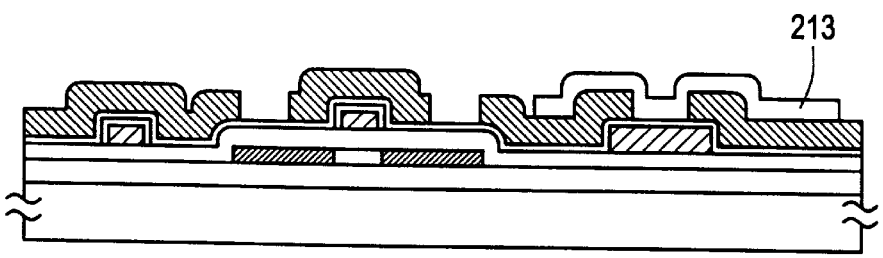

A pixel electrode 213 is formed by an ITO film having a thickness of 500 Å. As a result, a capacitor 219 is formed wherein the pixel electrode 213 and the lower layer wiring 207 are used as both electrodes of the capacitor 219 and the anodic oxide and the silicon oxide film 208 are used as dielectric. (FIG. 2C)

Figure 2D:
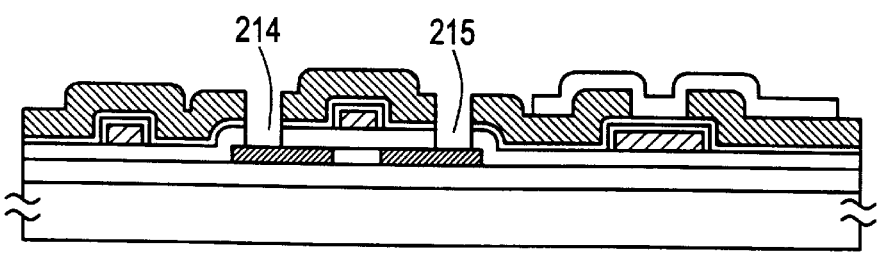

Then, anisotropic dry etching by a known reactive ion etching (RIE) is performed to etch the gate insulating film 204 of silicon oxide and the silicon oxide film 208. As can be seen from FIGS. 2C and 2D, a portion in which the silicon oxide film 208 is exposed is present in only the hole portions 210 and 211. since the hole portion 212 is covered with the pixel electrode 213 made of the ITO film, it is not etched. That is, in the embodiment, the pixel electrode 213 (or a mask used to form it) serves as a second mask according to the invention. Etching has anisotropy and selectively proceeds in a direction vertical to a substrate. Thus, contact holes 214 and 215 are formed. (FIG. 2D)

Figure 2E:
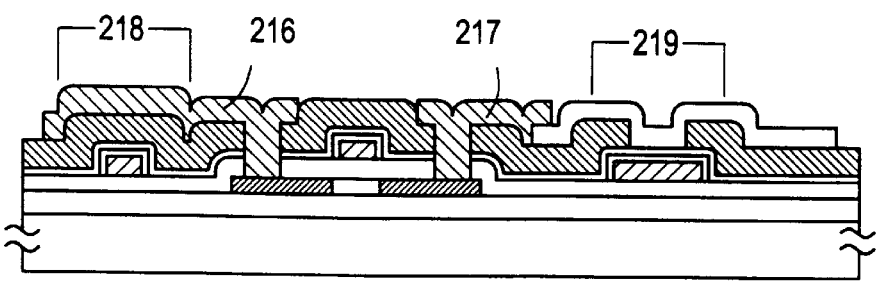

An aluminum film having a thickness of 4000 Å is formed by sputtering and then etched to form upper layer wiring-electrodes 216 and 217. In a portion 218, although the upper layer wiring 216 intersects the lower layer wiring 205, since the anodic oxide having a thickness of 1000 Å is formed in addition to an interlayer insulator which is constructed by the silicon oxide film 208 having a thickness of 300 Å and the silicon nitride film 209 having a thickness of 4700 Å, sufficient insulation can be obtained. In the capacitor 219, since dielectric is thin sufficiently, it is effective to decrease a capacitor area. (FIG. 2E)

Embodiment 3

FIGS. 3A to 3E show a process for producing one pixel in a TFT array of an active matrix circuit used in a liquid crystal display device, according to the embodiment.

A silicon oxide film 302 having a thickness of 2000 Å is formed as a base oxide film on a substrate 301. An amorphous silicon film having a thickness of 500 Å is formed, and then is irradiated with an excimer laser light, to obtain a crystalline silicon film. The crystalline silicon film is etched to form an island silicon region. A gate insulating film 304 is formed by using a silicon oxide having a thickness of 1200 Å.

Figure 3A:
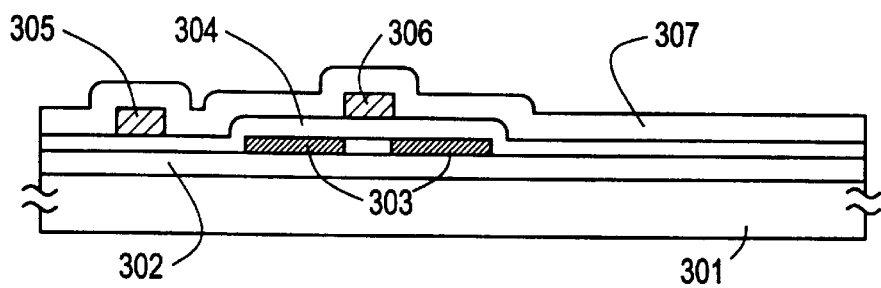
FIGS. 3A to 3E show a process for producing a TFT according to Embodiment 3.

A polycrystalline silicon film having good conductivity obtained by introducing phosphorus at a desired quantity is formed at a thickness of 3000 Å by low pressure CVD and then etched to form a gate electrode 306 and low layer wiring 305. Then, by ion doping, an impurity (phosphorus in the embodiment) is implanted into the island silicon region using the gate electrode 306 as a mask in a self-alignment, to form impurity regions 303. By plasma CVD, a silicon oxide film 307 having a thickness of 2000 to 8000 Å, for example, 5000 Å, is formed as a first interlayer insulator. (FIG. 3A)

Figure 3B:
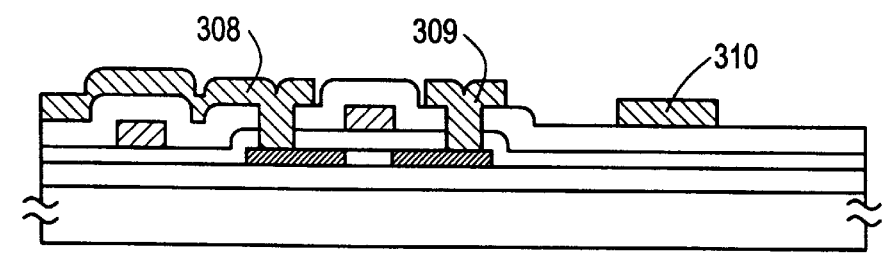

Contact holes are formed in the silicon oxide film 307 of the first interlayer insulator. An aluminum film having a thickness of 4000 Å is formed by sputtering, and then etched to form upper layer wirings 308, 309, and 310. (FIG. 3B)

Figure 3C:
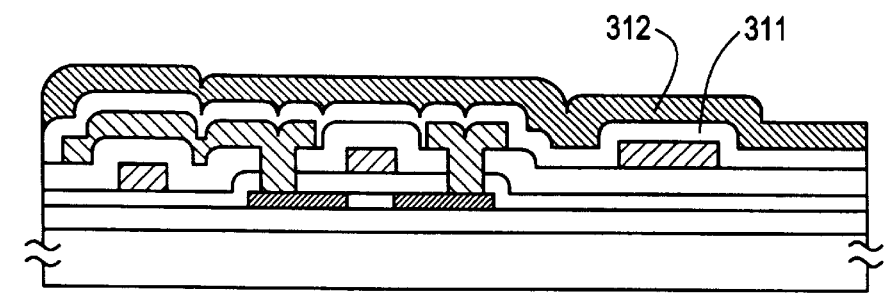

By plasma CVD, a silicon oxide film 311 having a thickness of 1000 Å and a silicon nitride film 312 having a thickness of 5000 Å are formed successively as a second interlayer insulator. (FIG. 3C)

Figure 3D:
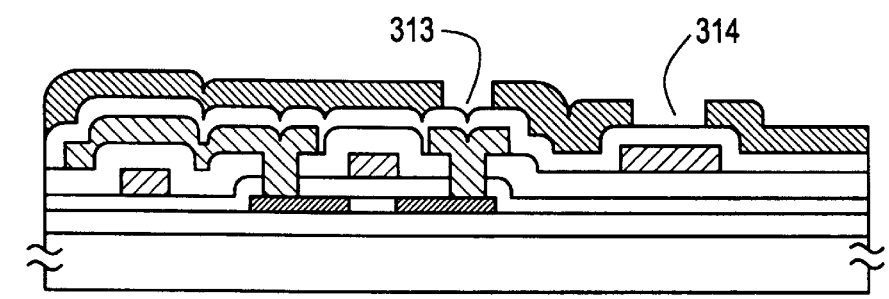

Using a first mask, a pattern is formed by a known photoresist method, and then the silicon nitride film 312 corresponding to an upper layer in the second interlayer insulator is etched by dry etching. The silicon oxide film 311 corresponding to the lower layer is used as an etching stopper. Thus, hole portions 313 and 314 are formed. (FIG. 3D)

A hole pattern is formed again inside the hole portion 313 by photolithography using a second mask. A hole pattern is not formed in the hole portion 314. By dry etching for silicon oxide, the silicon oxide film 311 in the hole portion 313 is etched to form a contact hole.

An ITO film having a thickness of 1000 Å is formed by sputtering and then etched, to form a pixel electrode 315 which is connected to the upper layer wiring 309. As described above, in the hole portion 313, the metal wiring (the drain electrode of a TFT) 309 corresponding to the upper layer is connected to the pixel electrode 315. In the hole portion 314, a capacitor 317 is formed between the ITO film 315 and the upper layer wiring 310 wherein the silicon oxide film 311 corresponding to the lower layer in the second interlayer insulator is used as dielectric. The capacitor 317 corresponds to a retaining capacitor in a TFT array of an active matrix circuit.

Figure 3E:
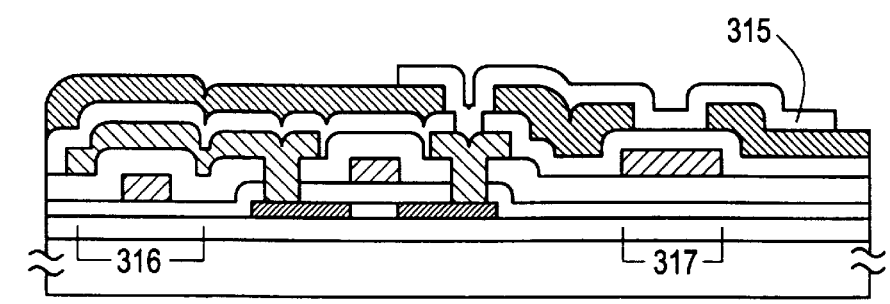

In a portion 316 in wnich the upper layer wiring 308 (corresponding to a source bus line of an active matrix circuit) is formed across on the lower layer wiring 305 (corresponding to a gate bus line of the active matrix circuit), since the silicon oxide film (the first interlayer insulator) 307 having a thickness of 5000 Å serves as an insulator, sufficient insulation can be obtained. (FIG. 3E)

Embodiment 4

FIGS. 4A to 4F show a process for producing an active matrix circuit used in a liquid crystal display device, according to the embodiment.

As described in Embodiment 1, a silicon oxide film 402 used as a base film and an island silicon region 403 are formed on a substrate 401, and then a silicon oxide film 404 having a thickness of 1200 Å is formed. Also, an aluminum film into which scandium is added (mixed) at 0.3 weight % is formed at a thickness of 5000 Å by sputtering. After a photoresist mask is formed, the aluminum film is etched to form a gate electrode 405 and lower layer wirings 406 and 407 of aluminum.

Figure 4A:
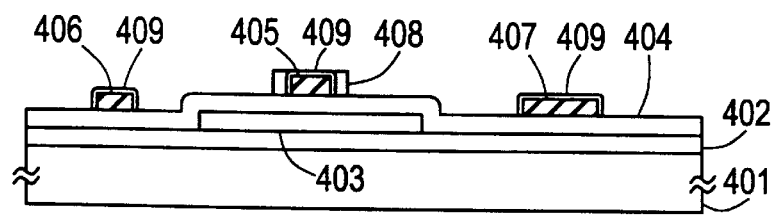
FIGS. 4A to 4F show a process for producing a TFT according to Embodiment 4.

Without removing the photoresist mask, only the gate electrode 405 is anodized, so that a porous anodic oxide 408 having a thickness of 4000 Å is formed in the side surfaces of the gate electrode 405. Then, the photoresist mask is removed (peeled off), and the gate electrode 405 and the lower layer wirings 406 and 407 are anodized in an electrolytic solution, to form a fine anodic oxide layer 409 having a thickness of 1000 Å. (FIG. 4A)

Various anodic oxides can be formed by changing an electrolytic solution to be used. When the porous anodic oxide 408 is formed, an acid solution containing citric acid, oxalic acid, chromic acid, or sulfuric acid at 3 to 20% is used. When the fine anodic oxide layer 409 is formed, an ethylene glycol solution containing tartaric acid, boric acid, or nitric acid at 3 to 10%, in which PH is adjusted to about 7 is used.

Figure 4B:
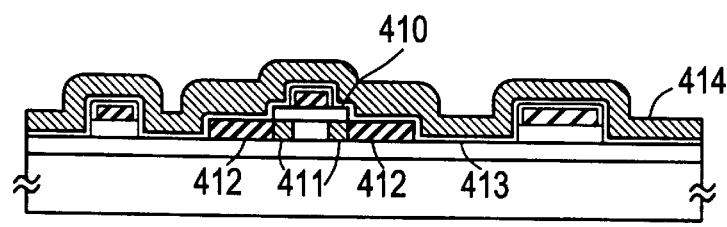

Using the gate electrode 405, the lower layer wirings 406 and 407, and the anodic oxide layers formed around them as masks, a silicon oxide film is etched to form a gate insulating film 410. After the porous anodic oxide 408 is removed, an impurity (phosphorus) is implanted into the island silicon region 403 by ion doping, using the gate electrode 405, the anodic oxide layer 409, and the gate insulating film 410 as masks. Since the gate insulating film 410 serves as a semitransparent mask, low concentration impurity regions (that is, LDDs, lightly doped drains) 411 and a high concentration impurity regions 412 are formed in the island silicon region 403 in a self-alignment. Then, by plasma CVD, a silicon oxide film 413 having a thickness of 300 Å and a silicon nitride film 414 having a thickness of 4700 Å are formed successively, to form a first insulating film. (FIG. 4B)

Figure 4C:
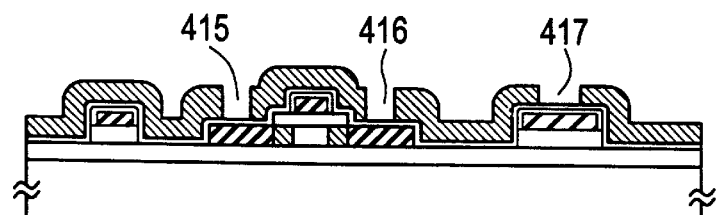

Using a first mask, hole portions 415, 416, and 417 are formed in the silicon nitride film 411 by dry etching. In this etching, the silicon oxide film 413 serves as an etching stopper. (FIG. 4C)

Figure 4D:
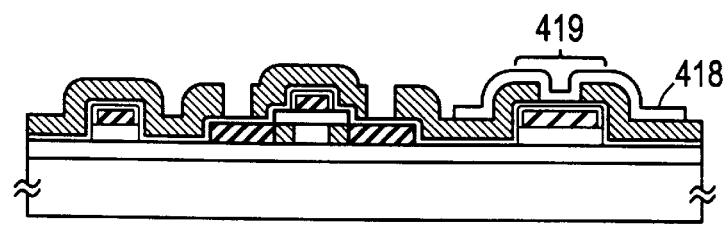
Figure 4E:
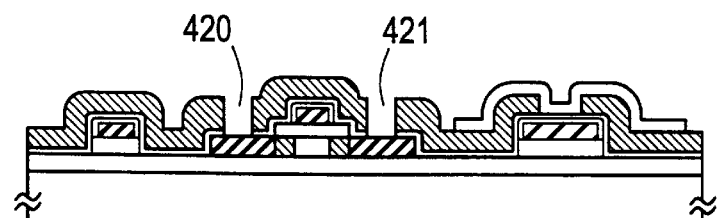

An ITO film having a thickness of 500 Å is formed and then patterned, to form a pixel electrode 418. Thus, a capacitor 419 is formed between the pixel electrode 418 and the lower layer wiring 407 wherein the anodic oxide layer 409 and the silicon oxide film 413 are used as dielectric. (FIG. 4D)

Figure 4F:
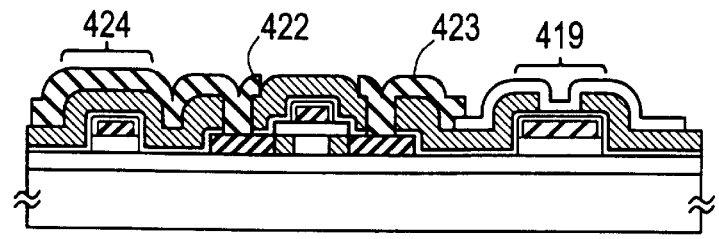

After that, by using anisotropic dry etching as known RIE, the silicon oxide film 413 is etched to from contact holes 420 and 421. As shown in FIG. 4D, portions that the silicon oxide film 413 is exposed are only the hole portions 415 and 416. Since the hole portion 417 is covered with the pixel electrode 418 made of the ITO film, it is not etched. In the embodiment, the pixel electrode 418 (or a mask used to form the electrode 418 serves as a second mask. Also, since etching having anisotropy is performed selectively in a vertical direction to a substrate, contact holes 420 and 421 are formed in the hole portions 415 and 416. (FIG. 4E) Then, an aluminum film having a thickness of 4000 Å is formed by sputtering and etched to form upper layer wiring-electrodes 422 and 423. The upper layer wiring 422 intersects the lower layer wiring 406 in a region 424. Since an interlayer insulator constructed by silicon oxide film having the thickness of 300 Å and the silicon nitride film having the thickness of 4700 Å and the anodic oxide layer 409 having the thickness of 1000 Å are formed in the region 424, sufficient insulation can be obtained. In the capacitor 419, the thickness of dielectric is sufficiently thin, and thus it is effective to reduce an area of the capacitor. (FIG. 4F)

In the embodiment, since a TFT has an LDD structure, off current characteristic can be improved. Thus, it is suitable as a TFT arranged in a pixel matrix.

Embodiment 5

FIGS. 5A to 5F show a process for producing an active matrix circuit used in a liquid crystal display device, according to the embodiment. In Embodiment 4, to obtain an LDD structure, a fine anodic oxide is formed around a gate electrode. However, in the embodiment, an LDD structure is formed without forming a fine anodic oxide.

Figure 5A:
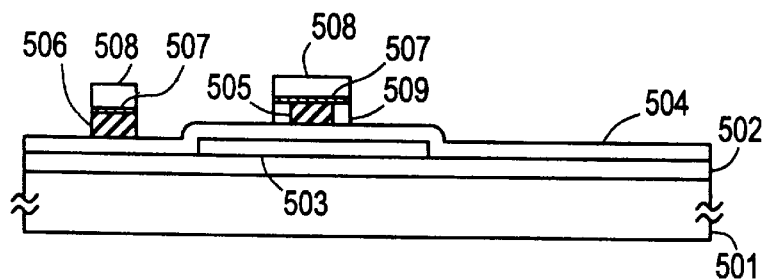
FIGS. 5A to 5F show a process for producing a TFT according to Embodiment 5.

In FIG. 5A, a silicon oxide film 502 (having a thickness of 2000 Å) used as a base film and an island silicon region 503 having a thickness of 500 Å are formed on a glass substrate 501. Further, a silicon oxide film 504 having a thickness of 1000 Å is formed by plasma CVD.

An aluminum film into which scandium is added (mixed) at 0.3 weight % is formed at a thickness of 5000 Å by sputtering. The aluminum film is used to form a gate electrode 505 and a lower layer wiring 506 in the following process. The aluminum film is anodized in an electrolytic solution to form a fine anodic oxide film 507 having a thickness of about 100 Å on the surface thereof. An ethylene glycol solution containing tartaric acid, boric acid, or nitric acid at 3 to 10%, in which PH is adjusted to about 7 is used as the electrolytic solution. A thickness of the fine anodic oxide film 507 can be controlled by a voltage applied to the aluminum film. The fine anodic oxide film 507 has a function for improving adhesion of a resist.

After a photoresist mask 508 is formed, the aluminum film is etched by using the mask 508 to form the gate electrode 505 and lower layer wiring 506. In an electrolytic solution, a voltage is applied to only the gate electrode 505 to perform anodization. An acid solution containing citric acid, oxalic acid or chromic acid at 3 to 20% is used as an electrolytic solution. In this case, since the photoresist mask 508 and the fine anodic oxide film 507 are formed on the surface of the gate electrode 505, a porous anodic oxide 509 is formed on only a side surface of the gate electrode 505. (FIG. 5A)

A growth distance of the porous anodic oxide 509 can be controlled by a current supply time to the gate electrode 505, and thus a length of a low concentration impurity region is determined by the growth distance. The porous anodic oxide 509 is grown at a length of 4000 Å.

Figure 5B:
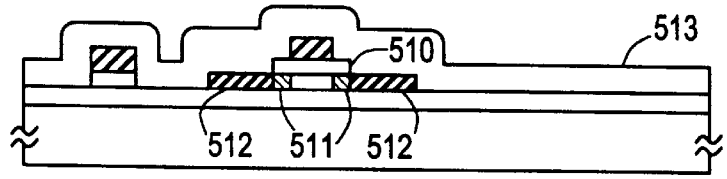

Using the photoresist mask 508, the silicon oxide film 504 is etched to form a gate insulating film 510. As shown in FIG. 5B, the photoresist mask 508, the porous anodic oxide 509, and the fine anodic oxide film 507 is removed successively to expose the gate electrode 505 and the lower layer wiring 506.

The photoresist mask 508 is removed using a desired peeling solution. The fine anodic oxide film 507 is etched using buffer hydrofluoric acid. Since the fine anodic oxide film is extremely thin, it can be removed selectively. The porous anodic oxide 509 is etched using mixture acid that phosphoric acid, acetic acid, and nitric acid are mixed one another. Since the porous anodic oxide 509 can be removed easily, the gate electrode 505 is not etched.

Using the gate electrode 505 and the gate insulating film 510 as masks, an impurity is implanted into the island silicon region 503 by ion doping. In this state, by setting a suitable condition for dose, accelerating speed, and the like, since the gate insulating film 510 serves as a semitransparent mask, low concentration impurity regions 511 are formed just under the gate insulating film 510 and high concentration impurity regions 512 are formed in a region in which is not covered with the gate insulating film. By plasma CVD, a silicon oxide film 513 having a thickness of 2000 to 8000 Å, for example, 5000 Å, is formed as a first interlayer insulator. (FIG. 5B)

Figure 5C:
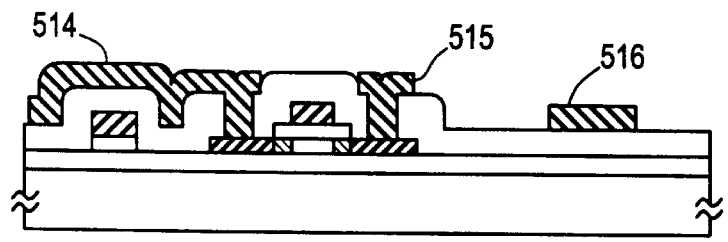

Contact holes are formed in the silicon oxide film 513. An aluminum film having a thickness of 4000 Å is deposited by sputtering and then etched to form upper layer wirings 514, 515, and 516. (FIG. 5C)

Figure 5D:
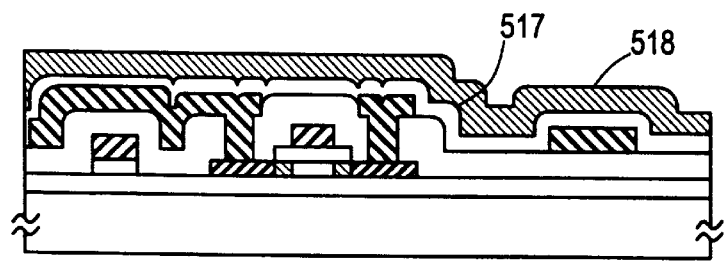

By plasma CVD, a silicon oxide film 517 having a thickness of 1000 Å and a silicon nitride film 518 having thickness of 5000 Å are deposited successively as a second interlayer insulator. Then, using the first mask, a pattern is formed by a known photoresist method, and the silicon nitride film 518 corresponding to the upper layer in the second interlayer insulator is etched by dry etching to form hole portions 519 and 520. In this state, the silicon oxide film 517 corresponding to the lower layer serves as an etching stopper. (FIG. 5D)

Figure 5E:
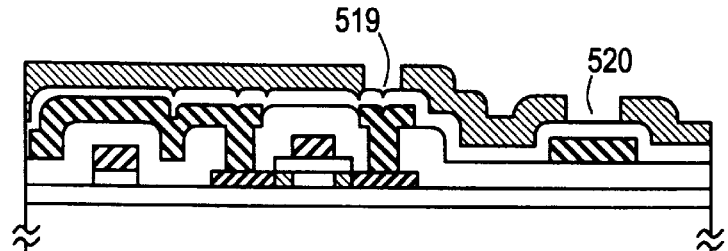

A hole pattern is formed inside the hole portion 519 again by photolithography using a second mask. In the hole portion 520, a hole pattern is not formed. By dry etching, the silicon oxide film 517 in the hole portion 519 is etched to form a contact hole. (FIG. 5E)

An ITO film having a thickness of 1000 Å is formed by sputtering and then etched to form a pixel electrode 521 connecting with the upper layer wiring 515. Thus, in the hole portion 519, the upper layer metal wiring (the drain electrode of a TFT) 515 and the pixel electrode 521 are connected each other. In the hole portion 520, a capacitor 522 (corresponding to a retaining capacitor in a TFT array of an active matrix circuit) is formed between the pixel electrode 521 made of the ITO film and the upper layer wiring 516 wherein the silicon oxide film 517 corresponding to the lower layer in the second interlayer insulator is dielectric.

Figure 5F:
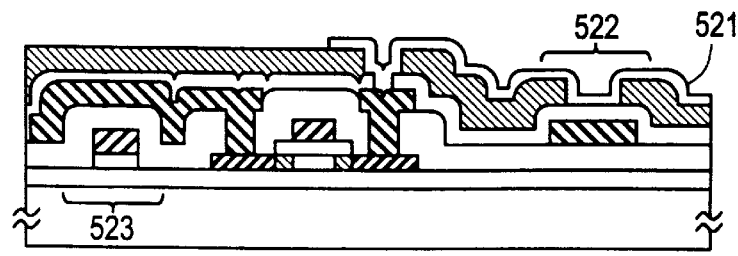

In a portion 523 that the upper layer wiring 514 (corresponding to a source bus line of an active matrix circuit) intersects on the lower layer wiring 506 (corresponding to a gate bus line of the active matrix circuit), since the silicon oxide film (the first interlayer insulator) 513 having the thickness of 5000 Å serves as dielectric, sufficient insulation can be obtained. (FIG. 5F)

In a TFT of the embodiment, since the low concentration impurity regions 511 are formed between the high concentration impurity region (drain region) 512 and a channel forming region, high voltage application between the channel forming region and the drain region can be prevented, and off current can be reduced.

According to the present invention, contact holes and a capacitor can be formed simultaneously in an interlayer insulator. In particular, a capacitance of a capacitor is increased by the present invention. Also, new added value can be provided with an integrated circuit. The present invention is useful in industry.

What is claimed is:

1. An active matrix device comprising:
   a substrate;
   a thin film transistor formed over said substrate, said thin film transistor comprising a crystalline semiconductor film including at least source, drain and channel regions;
   a first electrode formed over said substrate;
   a first interlayer insulating film formed over said first electrode, said first interlayer insulating film covering said thin film transistor;
   a second interlayer insulating film comprising a different material from said first interlayer insulating film formed on said first interlayer insulating film;
   an opening selectively formed in said second interlayer insulating film to expose a surface of said first interlayer insulating film therein;
   a second electrode formed on said first interlayer insulating film in said opening and
   a capacitor formed between said first and second electrodes in said opening with at least said first interlayer insulating film interposed therebetween.

2. An active matrix device according to claim 1 wherein said second electrode extends on a portion of said second interlayer insulating film.

3. An active matrix device according to claim 1 wherein said first interlayer insulating film comprises silicon oxide.

4. An active matrix device according to claim 1 wherein said second interlayer insulating film comprises silicon nitride.

5. An active matrix device according to claim 1 wherein said active matrix device is a liquid crystal display device.

6. An active matrix device comprising:
   a substrate;
   a thin film transistor formed over said substrate, said thin film transistor including at least source, drain and channel regions;
   a first electrode formed over said substrate;
   a first interlayer insulating film formed over said first electrode, said first interlayer insulating film covering said thin film transistor;
   a second interlayer insulating film comprising a different material from said first interlayer insulating film formed on said first interlayer insulating film;
   an opening selectively formed in said second interlayer insulating film to expose a surface of said first interlayer insulating film therein;
   a second electrode formed on said first interlayer insulating film in said opening; and
   a capacitor operatively connected to said thin film transistor; said first interlayer insulating film interposed therebetween.

7. An active matrix device according to claim 6 wherein said first interlayer insulating film comprises silicon oxide.

8. An active matrix device according to claim 6 wherein said second interlayer insulating film comprises silicon nitride.

9. An active matrix device according to claim 6 wherein said second electrode is electrically connected to one of said source and drain regions of said thin film transistor.

10. An active matrix device according to claim 6 further comprising a third interlayer insulating film between said first electrode and said thin film transistor.

11. An active matrix device according to claim 6 wherein said second electrode extends on a portion of said second interlayer insulating film.

12. An active matrix device according to claim 6 wherein said active matrix device is a liquid crystal display device.

13. An active matrix device comprising:
   a substrate;
   a thin film transistor formed over said substrate, said thin film transistor comprising a crystallline semiconductor film including at least source, drain and channel regions;
   a first electrode formed over said substrate;
   a first interlayer insulating film formed over said first electrode said first interlayer insulating film covering said thin film transistor;
   a second interlayer insulating film comprising a different material from said first interlayer insulating film formed on said first interlayer insulating film;
   an opening selectively formed in said second interlayer insulating film to expose a surface of said first interlayer insulating film therein;
   a pixel electrode electrically connected to one of said source end drain regions of said thin film transistor, said pixel electrode formed on said second interlayer insulating film and extend into said opening; and
   a capacitor formed between said first electrode and said pixel electrode in said opening with at least said first interlayer insulating film interposed therebetween.

14. An active matrix device according to claim 13 wherein said first interlayer insulating film comprises silicon oxide.

15. An active matrix device according to claim 13 wherein said second interlayer insulating film comprises silicon nitride.

16. An active matrix device according to claim 13 further comprising a third interlayer insulating film between said first electrode and said thin film transistor.

17. An active matrix device according to claim 13 further comprising a drain electrode connected to said drain of the thin film transistor, wherein said first electrode is formed in a same process as said drain electrode.

18. An active matrix device according to claim 13 wherein said first electrode is formed in a same level a gate electrode of said thin film transistor.

19. An active matrix device according to claim 13 wherein said active matrix device is a liquid crystal display device.

20. An active matrix device comprising:
   a substrate;
   a thin film transistor provided over said substrate, said thin film transistor comprising a crystalline semiconductor film, a gate electrode and a gate insulating film located between said crystalline semiconductor film and said gate electrode, wherein said crystalline semiconductor film has source and drain regions, a channel region and at least one LDD region located between one of said source and drain regions and said channel region;
   a first electrode formed over said substrate;
   a first interlayer insulating film to cover said thin film transistor, said first interlayer insulating film comprising silicon oxide;
   a second interlayer insulating film provided over said first interlayer insulating film, said second interlayer insulating film compnising silicon nitride;
   an opening selectively formed in said second interlayer insulating film to expose a surface of said first interlayer insulating film therein;

a pixel electrode provided on said first interlayer insulating film in said opening; and a capacitor formed between said first electrode and said pixel electrode in said opening with at least said first interlayer insulating film interposed therebetween, wherein a boundary between said LDD region and said channel region is aligned with a side edge of said gate electrode.

21. An active matrix device according to claim 20 wherein said pixel electrode comprises indium tin oxide.

22. An active matrix device according to claim 20 wherein said thin film transistor is an n-channel type.

23. An active matrix device according to claim 20 wherein said gate electrode is located over said semiconductor film.

24. An active matrix device according to claim 20 wherein said active matrix device is a liquid crystal display device.

25. An active matrix device comprising:

a substrate;

a thin film transistor provided over said substrate, said thin film transistor comprising a crystalline semiconductor film, a gate electrode and a gate insulating film located between said crystalline semiconductor film and said gate electrode;

a first interlayer insulating film to cover said thin film transistor;

a wiring provided on said first interlayer insulating film;

a second interlayer insulating film provided on said first interlayer insulating film;

a third interlayer insulating film provided on said second interlayer insulating film, said third interlayer insulating film having an opening to expose a surface of said second interlayer insulating film;

a pixel electrode provided on said third interlayer insulating film; and a capacitor provided between said wiring and said pixel electrode in said opening with said second interlayer insulating film interposed therebetween, wherein said crystalline semiconductor film comprises a pair of impurity regions and a channel region located between said pair of impurity regions, said pair of impurity regions comprises an n-type impurity, and wherein said third interlayer insulating film comprises a different material from said first and second interlayer insulating films.

26. An active matrix device according to claim 25 wherein said first interlayer insulating film comprises silicon oxide.

27. An active matrix device according to claim 25 wherein said pixel electrode comprises indium tin oxide.

28. An active matrix device according to claim 25 wherein said ntype impurity is phosphorus.

29. An active matrix device according to claim 25 wherein said active matrix device is a liquid crystal display device.

30. An active matrix device comprising:

a substrate;

a thin film transistor provide over said substrate, said thin film transistor comprising a crystalline semiconductor film, a gate electrode and a gate insulating film located between said crystalline semiconductor film and said gate electrode, wherein said crystalline semiconductor film has source and drain regions, a channel region and at least one LDD region located between one of said source and drain regions and said channel region;

a wiring provided over said substrate;

a first interlayer insulating film to cover said thin film transistor and said wiring;

a second interlayer insulating film provided over said first interlayer insulating film;

an opening selectively formed through said second interlayer insulating film to expose a surface of said first interlayer insulating film;

an electrode provided over said second interlayer insulating film, said electrode being in contact with said first interlayer insulating film in said opening; and a capacitor operatively connected to said thin film transistor, said capacitor provided between said wiring and said electrode in said opening with said first interlayer insulating film interposed therebetween, wherein said first interlayer insulating film comprises a different material from said second interlayer insulating film, and wherein a boundary between said LDD region and said channel region is aligned with a side edge of said gate electrode.

31. An active matrix device according to claim 30 wherein said first interlayer insulating film comprises silicon oxide.

32. An active matrix device according to claim 30 wherein said second interlayer insulating film comprises silicon nitride.

33. An active matrix device according to claim 30 wherein said wiring comprises aluminum.

34. An active matrix device according to claim 30 wherein said electrode comprises indium tin oxide.

35. An active matrix device according to claim 30 wherein said thin film transistor is an n-channel type.

36. An active matrix device according to claim 30 wherein said gate electrode is located over said semiconductor film.

37. An active matrix device according to claim 30 wherein said active matrix device is a liquid crystal display device.

38. An active matrix device comprising:

a substrate;

a thin film transistor provided over said substrate, said thin film transistor comprising a semiconductor film, a gate electrode and a gate insulating film located between said semiconductor film and said gate electrode, wherein said semiconductor film has source and drain regions, a channel region and at least one LDD region located between one of said source and drain regions and said channel region;

a first interlayer insulating film provided to cover said thin film transistor;

a wiring provided on said first interlayer insulating film;

a second interlayer insulating film provided on said first interlayer insulating film and said wiring;

a third interlayer insulating film provided on said second interlayer insulating film, said third interlayer insulating film having an opening to expose a surface of said second interlayer insulating film;

an electrode provided on said third interlayer insulating film, said electrode being in contact with said second interlayer insulating film in said opening; and a capacitor operatively connected to said thin film transistor, said capacitor provided between said wiring and said electrode in said opening with said second interlayer insulating film interposed therebetween, wherein said third interlayer insulating film comprises a different material from said second interlayer insulating film.

39. An active matrix device according to claim 38 wherein said first interlayer insulating film comprises silicon oxide.

40. An active matrix device according to claim 38 wherein said second interlayer insulating film comprises silicon oxide while said third interlayer insulating film comprises silicon nitride.

41. An active matrix device according to claim 38 wherein said electrode is a pixel electrode comprising indium tin oxide.

42. An active matrix device according to claim 38 wherein said thin film transistor is an n-channel type.

43. An active matrix device according to claim 38 wherein said gate electrode is located over said semiconductor film.

44. An active matrix device according to claim 38 wherein a boundary between said LDD region and said channel region is aligned with a side edge of said gate electrode.

45. An active matrix device according to claim 38 wherein said active matrix device is a liquid crystal display device.

46. An active matrix device comprising:

a substrate;

a wiring formed over said substrate;

a thin film transistor provided over said substrate, said thin film transistor comprising a semiconductor film, a gate electrode and a gate insulating film located between said semiconductor film and said gate electrode, wherein said semiconductor film has a source region, a drain region, a channel region and at least one LDD region;

a first interlayer insulating film to cover said thin film transistor, said first interlayer insulating film comprising silicon oxide;

a second interlayer insulating film provided in contact with said first interlayer insulating film, said second interlayer insulating film comprising silicon nitride;

a pixel electrode electrically connected to one of said source region and said drain region;

at least one of a source electrode connected to said source region and a drain electrode connected to said drain region; and a capacitor operatively connected to said thin film transistor and provided between said wiring and said pixel electrode with at least said first interlayer film interposed therebetween.

47. An active matrix device according to claim 46 wherein said semiconductor film is formed of crystalline silicon.

48. An active matrix device according to claim 47 wherein said thin film transistor is an n-channel type, and said gate electrode and said at least one LDD region are not overlapped with each other.

49. An active matrix device according to claim 46 wherein said active matrix device is a liquid crystal display device.

* * * * *